(12) United States Patent
Kim

(10) Patent No.: US 12,563,720 B2
(45) Date of Patent: Feb. 24, 2026

(54) SEMICONDUCTOR DEVICE

(71) Applicant: SAMSUNG ELECTRONICS CO., LTD., Suwon-si (KR)

(72) Inventor: Youngwoo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 18/200,248

(22) Filed: May 22, 2023

(65) Prior Publication Data

US 2024/0023325 A1     Jan. 18, 2024

(30) Foreign Application Priority Data

Jul. 14, 2022    (KR) ........................ 10-2022-0087138

(51) Int. Cl.
H01L 29/76 (2006.01)
H10B 12/00 (2023.01)
H10D 62/10 (2025.01)

(52) U.S. Cl.
CPC ........... H10B 12/50 (2023.02); H10B 12/482 (2023.02); H10D 62/115 (2025.01)

(58) Field of Classification Search
CPC .... H10B 12/50; H10B 12/482; H10B 12/053; H10B 12/485; H10B 12/315; H10B 12/36; H10D 62/115
USPC ....................................................... 257/296
See application file for complete search history.

(56) References Cited

U.S. PATENT DOCUMENTS

| | | | |
|---|---|---|---|
| 9,859,283 B1 * | 1/2018 | Feng | .................... H10B 12/482 |
| 10,453,849 B2 | 10/2019 | Liou et al. | |
| 10,879,398 B2 | 12/2020 | Lee et al. | |
| 2012/0228678 A1 * | 9/2012 | Han | ........................ H10B 12/09 |
| | | | 257/288 |
| 2012/0273876 A1 | 11/2012 | Kim | |
| 2021/0082924 A1 | 3/2021 | Seong et al. | |

FOREIGN PATENT DOCUMENTS

| | | |
|---|---|---|
| CN | 110880508 A | 3/2020 |
| KR | 10-2010-0031564 A | 3/2010 |
| KR | 10-1114292 B1 | 3/2012 |
| KR | 10-2014-0028302 | 3/2014 |

* cited by examiner

*Primary Examiner* — Theresa T Doan
(74) *Attorney, Agent, or Firm* — Muir Patent Law, PLLC

(57)     ABSTRACT

A semiconductor device includes a substrate having a cell array region, a peripheral circuit region, and a connection region between the cell array region and the peripheral circuit region; a device isolation region defining a cell active region on the cell array region, a peripheral active region on the peripheral circuit region, and a dummy active region on the connection region; and a gate structure including a gate electrode extending into the device isolation region on the connection region across the cell active region on the cell array region, wherein the dummy active region is adjacent to the cell active region, and wherein an upper surface of the dummy active region vertically overlapping the gate structure is positioned on a level lower than a level of an upper surface of the cell active region vertically overlapping the gate structure.

20 Claims, 11 Drawing Sheets

100C

SEMICONDUCTOR DEVICE

CROSS-REFERENCE TO RELATED APPLICATION(S)

This application claims benefit under 35 U.S.C. § 119 to Korean Patent Application No. 10-2022-0087138 filed on Jul. 14, 2022 in the Korean Intellectual Property Office, the disclosure of which is incorporated herein by reference in its entirety.

BACKGROUND

1. Field

Embodiments relate to a semiconductor device.

2. Description of the Related Art

With the development of the electronics industry and the needs of users, electronic devices have become smaller in size and higher in performance. Accordingly, semiconductor devices used in electronic devices are also required to have a high degree of integration and to implement high performance. In order to manufacture a high-performance semiconductor device, word lines are formed to have a narrower line width, and accordingly a defect such as a breakage of the word lines may occur.

SUMMARY

The embodiments may be realized by providing a semiconductor device, comprising a substrate having a cell array region, a peripheral circuit region, a connection region between the cell array region and the peripheral circuit region; a device isolation region defining a cell active region on the cell array region, a peripheral active region on the peripheral circuit region, and a dummy active region on the connection region; a gate structure including a gate electrode extending into the device isolation region on the connection region across the cell active region on the cell array region, wherein the dummy active region is adjacent to the cell active region, and wherein an upper surface of the dummy active region vertically overlapping the gate structure is positioned on a level lower than a level of an upper surface of the cell active region vertically overlapping the gate structure The embodiments may be realized by providing a semiconductor device, comprising a substrate having a cell array region, a peripheral circuit region, and a connection region between the cell array region and the peripheral circuit region, a device isolation region defining, on the substrate, a cell active region on the cell array region, a peripheral active region on the peripheral circuit region, and a dummy active region on the connection region, a gate structure including a gate electrode extending in a first direction across the cell active region and the dummy active region on the cell array region, wherein, in the first direction, a width of the dummy active region is wider than a width of the cell active region, and wherein a portion of a lower surface of the gate structure in contact with an upper surface of the dummy active region is positioned on a level lower than that of a portion of the lower surface of the gate structure in contact with an upper surface of the cell active region.

The embodiments may be realized by providing a semiconductor device, comprising a substrate having a cell array region, a peripheral circuit region, a connection region between the cell array region and the peripheral circuit region; a bit line structure on the cell array region, the bit line structure including a bit line and a bit line contact pattern connected to a lower surface of the bit line; a dummy bit line structure on the connection region, the dummy bit line structure including a dummy bit line; a cell active region below the bit line structure and electrically connected to the bit line through the bit line contact pattern; a dummy active region below the dummy bit line structure and electrically insulated from the dummy bit line; and a gate structure including a gate electrode extending across the cell active region on the cell array region, wherein a distance between an upper surface of the dummy active region and a lower surface of the dummy bit line is greater than a distance between an upper surface of the cell active region and a lower surface of the bit line.

BRIEF DESCRIPTION OF DRAWINGS

Features will become apparent to those of skill in the art by describing in detail exemplary embodiments with reference to the attached drawings in which:

FIG. 2A illustrates cross-sections of the semiconductor device of FIG. 1 taken along lines I-I' and II-II';

FIG. 2B is a cross-sectional view of the semiconductor device of FIG. 1 taken along line III-III';

FIG. 2C is a cross-sectional view of the semiconductor device of FIG. 1 taken along line IV-IV;

DETAILED DESCRIPTION

Figure 1:
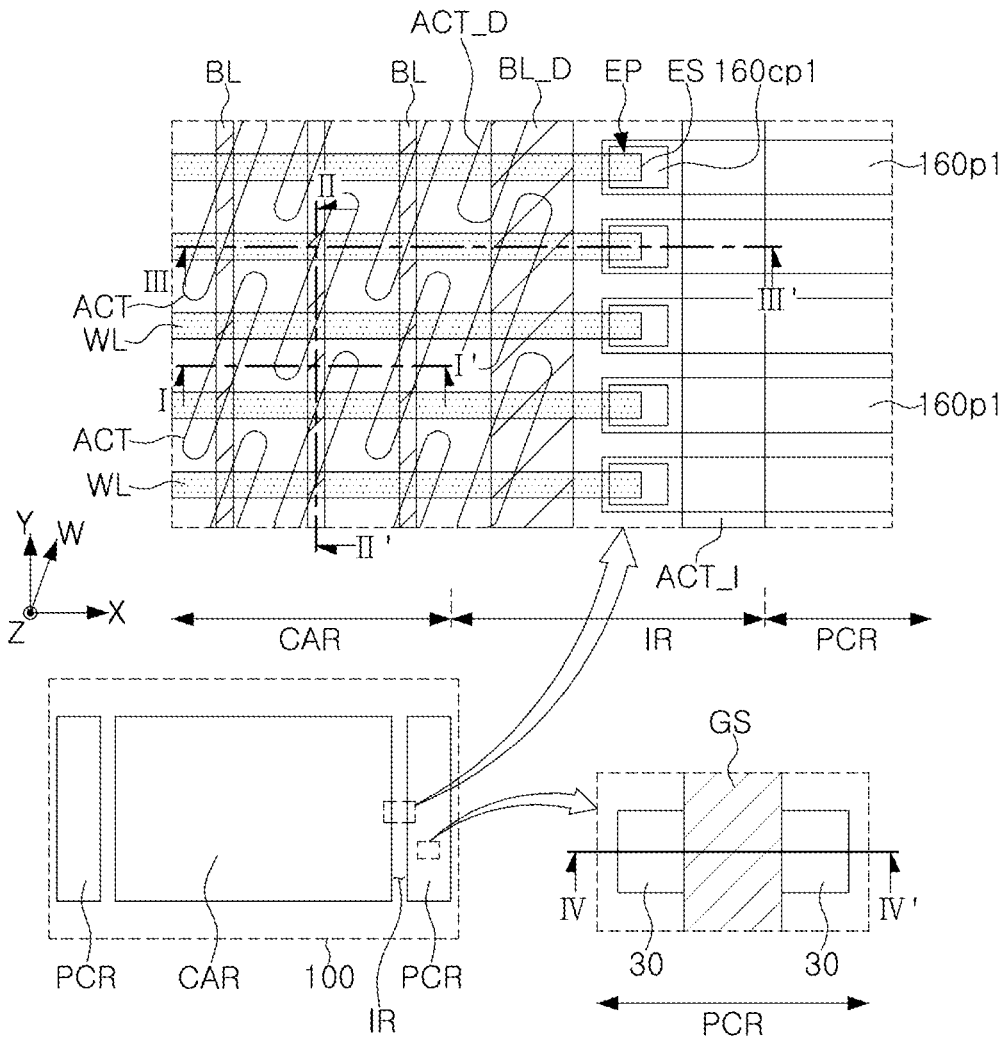
FIG. 1 is a schematic plan view of a semiconductor device according to an example embodiment.

Hereinafter, terms such as "top," "upper portion," "upper surface," "above," "bottom," "lower portion," "lower surface," "below," and "side surface" can be understood as being referred to based on the drawings except for being denoted by reference numerals.

FIG. 1 is a schematic plan view of a semiconductor device according to an example embodiment.

Figure 2A:
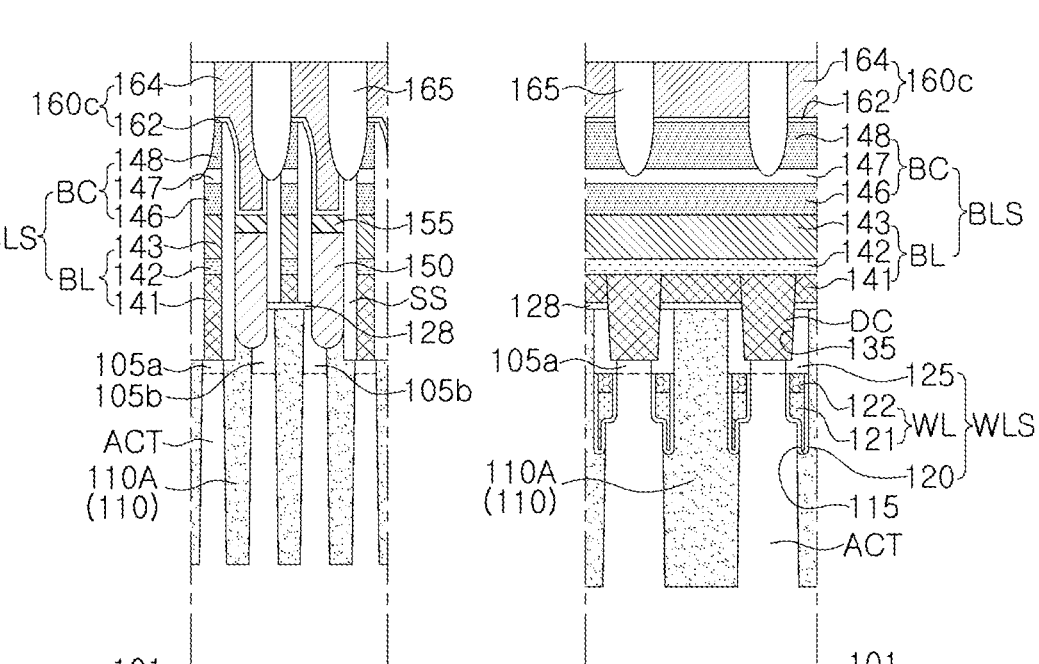
FIG. 2A is a schematic cross-sectional view of a semiconductor device according to an example embodiment.
Figure 2B:
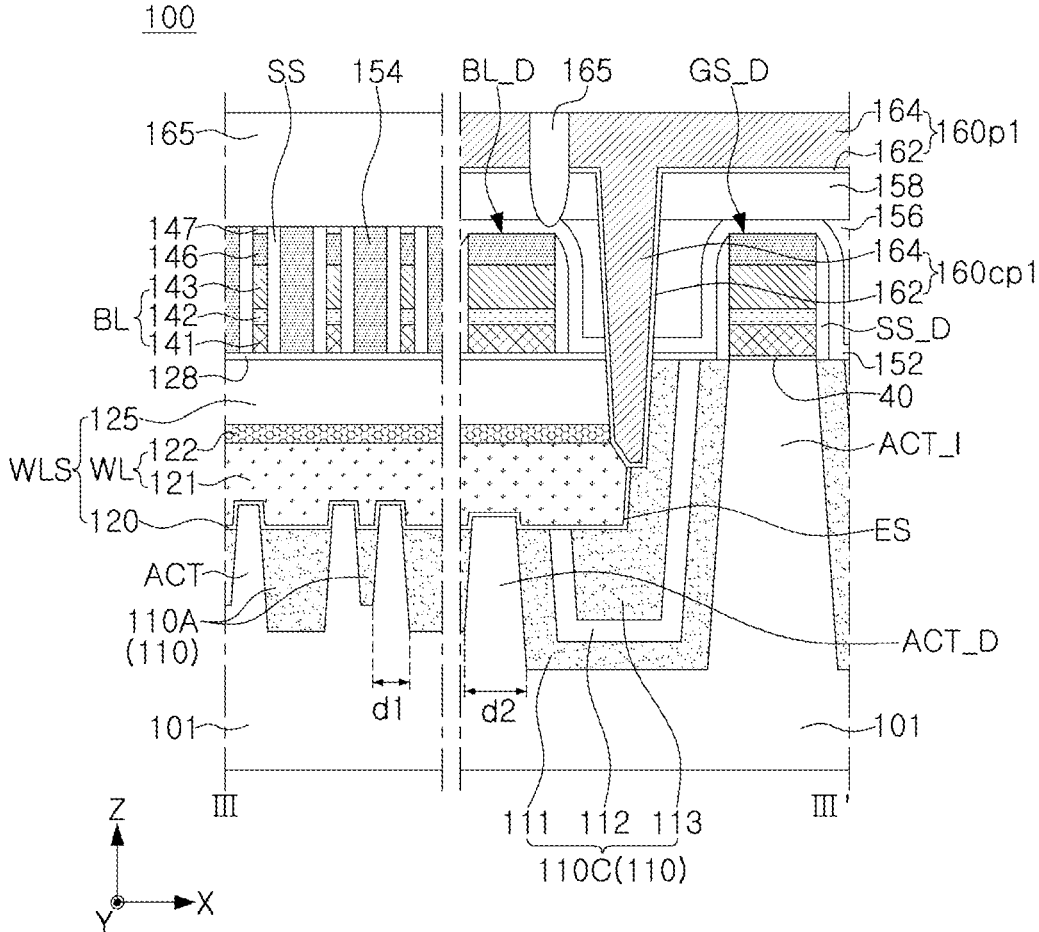
FIG. 2B is a schematic cross-sectional view of a semiconductor device according to example embodiments.

FIG. 2A is a schematic cross-sectional view of a semiconductor device according to an example embodiment. FIG. 2A illustrates cross-sections of the semiconductor device of FIG. 1 taken along lines I-I' and FIG. 2B is a schematic cross-sectional view of a semiconductor device according to example embodiments. FIG. 2B is a cross-sectional view of the semiconductor device of FIG. 1 taken along line III-III'.

Figure 2C:
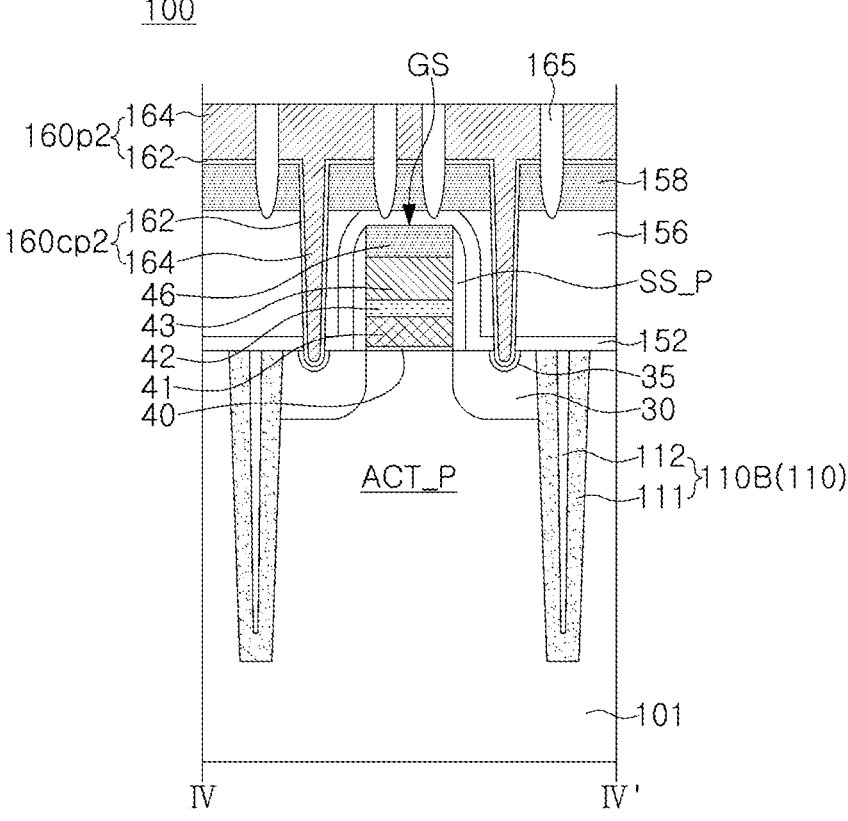
FIG. 2C is a schematic cross-sectional view of a semiconductor device according to example embodiments.

FIG. 2C is a schematic cross-sectional view of a semiconductor device according to example embodiments. FIG.

2C is a cross-sectional view of the semiconductor device of FIG. 1 taken along line IV-IV'.

Referring to FIG. 1, a semiconductor device 100 may include a cell array region CAR, a peripheral circuit region PCR for driving the cell array region CAR, and a connection region IR between the cell array region CAR and the peripheral circuit region PCR. Herein, the regions CAR, PCR, and IR may be defined and described in a substrate 101 (see FIGS. 2A to 7C). The cell array region CAR may be a region in which memory cells are disposed. The peripheral circuit region PCR may be disposed around the cell array region CAR. The peripheral circuit region PCR may be a region in which a word line driver, a sense amplifier, row and column decoders, and control circuits are disposed. The connection region IR may be a region for electrically connecting the cell array region CAR and the peripheral circuit region PCR to each other. As an example, in the connection region IR, a word line WL may be connected to a contact plug 160cp1, and the contact plug 160cp1 may be connected to an upper conductive pattern 160p1.

Referring to FIGS. 1 to 2C, the semiconductor device 100 may include a substrate 101 including active regions ACT, a device isolation region 110 defining the active regions ACT in the substrate 101, a word line structure WLS buried in the substrate 101 and extending, the word line structure WLS including a word line WL, and a bit line structure BLS extending across the word line structure WLS on the substrate 101, the bit line structure BLS including a bit line BL. The active regions ACT, the word line structure WLS, and the bit line structure BLS may be disposed in the cell array region CAR.

The semiconductor device 100 may further include a lower conductive pattern 150 on the active region ACT, a first upper conductive pattern 160c on the lower conductive pattern 150, a contact plug 160cp1 connected to the word line WL in the connection region IR, a second upper conductive pattern 160p1 on the contact plug 160cp1, a peripheral contact plug 160cp2 connected to the peripheral source/drain region in the peripheral circuit region PCR, a third upper conductive pattern 160p2 on the peripheral contact plug on 160cp2, and an insulating pattern 165 passing through the upper conductive patterns 160c, 160p1, and 160p2.

The semiconductor device 100 may further include a peripheral transistor disposed on the substrate 101 in the peripheral circuit region PCR, an insulating liner 152, and interlayer insulating layers 156 and 158. The peripheral transistor may include a peripheral gate dielectric layer 40, peripheral circuit gate electrodes 41, 42, and 43, and a peripheral source/drain region 30.

The semiconductor device 100 may include, for example, a cell array of a dynamic random access memory (DRAM). For example, the bit line BL may be connected to a first impurity region 105a of the active region ACT, and a second impurity region 105b of the active region ACT may be electrically connected to a capacitor structure on the first upper conductive pattern 160c through the lower and upper conductive patterns 150 and 160c. In an implementation, the capacitor structure may include, for example, a lower electrode, a capacitor dielectric layer, and an upper electrode, and a structure thereof is not particularly limited.

The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be a silicon substrate, a silicon on insulator (SOI) substrate, a germanium substrate, a germanium on insulator (GOI) substrate, a silicon-germanium substrate, or a substrate including an epitaxial layer.

The active regions ACT may be defined in the substrate 101 by the device isolation region 110. The active region ACT may have a bar shape, and may be disposed in the substrate 101 to have an island shape extending in a direction, for example, a W-direction. The W-direction may be a direction inclined with respect to a direction of extension of word lines WL and bit lines BL. The active regions ACT may be arranged parallel to each other, and an end portion of one active region ACT may be arranged adjacent to a central portion of another active region ACT adjacent thereto.

The active region ACT may have first and second impurity regions 105a and 105b having a predetermined depth from an upper surface of the substrate 101. The first and second impurity regions 105a and 105b may be spaced apart from each other. The first and second impurity regions 105a and 105b may serve as source/drain regions of a transistor formed by the word line WL. For example, a drain region may be formed between two word lines WL crossing one active region ACT, and a source region may be formed outside the two word lines WL, respectively. The source region and the drain region may be formed by the first and second impurity regions 105a and 105b by doping or ion implantation with substantially the same impurities. The source region and the drain region may be interchangeably referred to depending on a circuit configuration of a finally formed transistor. The impurities may include dopants having a conductivity type opposite to that of the substrate 101. In example embodiments, depths of the first and second impurity regions 105a and 105b in the source region and the drain region may be different from each other.

The device isolation region 110 may be formed by a shallow trench isolation (STI) process. The device isolation region 110 may surround the active regions ACT and electrically isolate the active regions ACT from each other. The device isolation region 110 may be formed of an insulating material, for example, silicon oxide, silicon nitride, or a combination thereof. The device isolation region 110 may include a plurality of regions having different lower end depths depending on a width of a trench with which the substrate 101 is etched.

The device isolation region 110 may include a first device isolation layer 110A defining a cell active region ACT on the cell array region CAR, a second device isolation layer 110B defining a peripheral active region ACT_P on the peripheral circuit region PCR, and a third device isolation layer 110C defining an active region ACT_I on the connection region IR.

The dummy active region ACT_D may be disposed below the word line structure WLS, on the connection region IR. The dummy active region ACT_D may be defined by the first device isolation layer 110A and the third device isolation layer 110C. In a first direction X, a width d2 of the dummy active region ACT_D may be wider than a width d1 of the cell active region ACT. For example, the width d2 of the dummy active region ACT_D may be in a range of about 1.5 to about 3 times the width d1 of the cell active region ACT. The dummy active region ACT_D may be adjacent to the cell active region ACT and the active region ACT_I.

An upper surface of the dummy active region ACT_D vertically overlapping the word line structure WLS may be positioned on a level lower than that of an upper surface of the cell active region ACT vertically overlapping the word line structure WLS. A distance between the upper surface of the dummy active region ACT_D and an upper surface of the word line WL may be greater than a distance between the upper surface of the cell active region ACT and the upper surface of the word line WL. For example, the upper surface of the dummy active region ACT_D vertically overlapping the word line structure WLS may be positioned on a level about 20 Å to about 500 Å lower than that of the upper surface of the cell active region ACT vertically overlapping the word line structure WLS. In some operations of a process of manufacturing the semiconductor device 100, the upper surface of the dummy active region ACT_D may be positioned on a level higher than that of the upper surface of the cell active region ACT. If the upper surface of the dummy active region ACT_D were to be positioned on a level higher than that of the upper surface of the cell active region ACT, there is a possibility that the word line WL could be broken due to the greater height of the dummy active region ACT_D. The present inventive concept may include a process of etching the dummy active region ACT_D in order to avoid the possibility of the word line WL being broken on account of a greater height of the dummy active region ACT_D. To provide that the upper surface of the dummy active region ACT_D vertically overlapping the word line structure WLS is positioned on a level lower than the level of the upper surface of the cell active region ACT vertically overlapping the word line structure WLS, only the dummy active region ACT_D could be etched without etching the cell active region ACT. In some example embodiments, the upper surface of the dummy active region ACT_D may be positioned on a level substantially the same as that of the upper surface of the cell active region ACT. The upper surface of the dummy active region ACT_D vertically overlapping the word line structure WLS may be adjacent to the dummy active region ACT_D, and may be positioned on a level higher than that of an upper surface of the first device isolation layer 110A vertically overlapping the word line structure WLS.

The dummy active region ACT_D may be disposed below a dummy bit line structure BL_D. Unlike the active region ACT being electrically connected to the bit line structure BLS, the dummy active region ACT_D may be electrically insulated from the dummy bit line structure BL_D. A distance between the upper surface of the dummy active region ACT_D and a lower surface of the dummy bit line structure BL_D may be greater than a distance between the upper surface of the cell active region ACT and a lower surface of the bit line BL. At least a portion of the dummy active region ACT_D may vertically overlap the dummy bit line structure BL_D.

On the connection region IR, the device isolation region 110 may include a plurality of layers. For example, as illustrated in FIG. 2B, the third device isolation layer 110C may include a first insulating liner 111, a second insulating liner 112, and a buried insulating layer 113 in a region adjacent to an end portion EP of the word line WL. The second insulating liner 112 may be disposed on the first insulating liner 111, and the buried insulating layer 113 may be disposed on the second insulating liner 112. In the etched trench of the substrate 101 in which the third device isolation layer 110C is disposed, the first insulating liner 111 and the second insulating liner 112 may be conformally formed along a surface of the trench in sequence. The buried insulating layer 113 may fill a space in which the first and second insulating liners 111 and 112 do not fill the trench. The second insulating liner 112 may include an insulating material different from that of the first insulating liner 111, and the buried insulating layer 113 may include an insulating material different from that of the second insulating liner 112. As an example, the first insulating liner 111 and the buried insulating layer 113 may include silicon oxide, and the second insulating liner 112 may include silicon nitride.

A lower surface of the third device isolation layer 110C may be positioned on a level lower than a lower surface of the first device isolation layer 110A.

The word line structures WLS may be disposed in gate trenches 115 extending in the substrate 101. Each of the word line structures WLS may include a gate dielectric layer 120, a word line WL, and a gate capping layer 125. Herein, the "gate 120 and WL" may be referred to as a structure including the gate dielectric layer 120 and the word line W., The word line WL may be referred to as a "gate electrode," and the word line structure WLS may be referred to as a "gate structure."

A lower surface of the word line structure WLS may be in contact with the upper surface of the cell active region ACT and the upper surface of the dummy active region ACT_D, respectively. A portion of the lower surface of the word line structure WLS in contact with the upper surface of the dummy active region ACT_D may be positioned on a level lower than that of a portion of the lower surface of the word line structure WLS in contact with the upper surface of the cell active region ACT.

The word line WL may be disposed to extend in the first direction X across the active region ACT. For example, a pair of adjacent word lines WL may be disposed to cross one active region ACT. The word line WL may be included in a gate of a buried channel array transistor (BCAT). The word line WL may be disposed below the gate trench 115 to have a predetermined thickness. The upper surface of the word line WL may be positioned on a level lower than that of the upper surface of the substrate 101. The high and low of the term "level" used herein may be defined based on a substantially flat upper surface of the substrate 101.

The word line WL may be formed of a conductive material, for example, at least one of polycrystalline silicon (Si), titanium (Ti), titanium nitride (TiN), tantalum (Ta), tantalum nitride (TaN), tungsten (W), tungsten nitride (WN), and aluminum (Al). As an example, the word line WL may include a lower pattern 121 and an upper pattern 122 formed of different materials.

As an example, the lower pattern 121 may include at least one of tungsten (W), titanium (Ti), tantalum (Ta), tungsten nitride (WN), titanium nitride (TiN), and tantalum nitride (TaN). As an example, the upper pattern 122 may be a semiconductor pattern including polysilicon doped with P-type or N-type impurities, and the lower pattern 121 may be a metal pattern including at least one of a metal and a metal nitride. A thickness of the lower pattern 121 may be greater than a thickness of the upper pattern 122. Each of the lower pattern 121 and the upper pattern 122 may extend in the first direction X.

The gate dielectric layer 120 may be disposed on bottom and inner surfaces of the gate trench 115. The gate dielectric layer 120 may conformally cover an inner wall of the gate trench 115. The gate dielectric layer 120 may include at least one of silicon oxide, silicon nitride, and silicon oxynitride. The gate dielectric layer 120 may be, for example, a silicon oxide film or a high-κ insulating film. In some implementations, the gate dielectric layer 120 may be a layer formed by oxidizing the active region ACT or a layer formed by deposition.

The gate capping layer 125 may be disposed to fill the gate trench 115 on the word line WL. An upper surface of the gate capping layer 125 may be positioned on a level substantially the same as that of the upper surface of the substrate 101. The gate capping layer 125 may be formed of an insulating material, for example, silicon nitride.

The bit line structure BLS may extend in a direction, perpendicular to the word line WL, for example, a Y-direction. The bit line structure BLS may include a bit line BL and a bit line capping pattern BC on the bit line BL. The bit line structure BLS may be disposed on the cell array region CAR, and the dummy bit line structure BL_D having a width in an X-direction wider than that of the bit line structure BLS may be disposed in the connection region IR. The dummy bit line structure BL_D may have a structure similar to that of the bit line structure BLS, except that the dummy bit line structure BL_D has a wider width.

The bit line BL may include a first conductive pattern 141, a second conductive pattern 142, and a third conductive pattern 143 being sequentially stacked. The bit line capping pattern BC may be disposed on the third conductive pattern 143. A buffer insulating layer 128 may be disposed between the first conductive pattern 141 and the substrate 101, and a portion of the first conductive pattern 141 (hereinafter, the bit line contact pattern DC) may be in contact with the first impurity region 105a of the active region ACT. The bit line BL may be electrically connected to the first impurity region 105a through the bit line contact pattern DC. A lower surface of the bit line contact pattern DC may be positioned on a level lower than that the upper surface of the substrate 101, and may be positioned on a level higher than that of the upper surface of the word line WL. In an example embodiment, the bit line contact pattern DC may be formed in the substrate 101 to be locally disposed in the bit line contact hole 135 exposing the first impurity region 105a.

The first conductive pattern 141 may include a semiconductor material such as polycrystalline silicon. The first conductive pattern 141 may be in direct contact with the first impurity region 105a. The second conductive pattern 142 may include a metal-semiconductor compound. The metal-semiconductor compound may be, for example, a layer obtained by silicidizing a portion of the first conductive pattern 141. For example, the metal-semiconductor compound may include cobalt silicide (CoSi), titanium silicide (TiSi), nickel silicide (NiSi), tungsten silicide (WSi), or other metal silicides. The third conductive pattern 143 may include a metal material such as titanium (Ti), tantalum (Ta), tungsten (W), and aluminum (Al). In some example embodiments, the number of conductive patterns forming the bit line BL, a type of material, and/or a stacking order may be changed in various manners.

The bit line capping pattern BC may include a first capping pattern 146, a second capping pattern 147, and a third capping pattern 148 being sequentially stacked on the third conductive pattern 143. The first to third capping patterns 146, 147, and 148 may respectively include an insulating material, for example, a silicon nitride film. The first to third capping patterns 146, 147, and 148 may be formed of different materials. Even through the first to third capping patterns 146, 147, and 148 include the same material, the first to third capping patterns 146, 147, and 148 may be distinguished from one another by a difference in physical properties. A thickness of the second capping pattern 147 may be less than a thickness of the first capping pattern 146 and a thickness of the third capping pattern 148, respectively. In some example embodiments, the number of capping patterns and/or a type of material included in the bit line capping pattern BC may be changed in various manners.

Spacer structures SS may be disposed on opposite sidewalls of each of the bit line structures BLS to extend in a direction, for example, the Y-direction. The spacer structures SS may be disposed between the bit line structure BLS and the lower conductive pattern 150. The spacer structures SS may be disposed to extend along sidewall s of the bit line BL and sidewalls of the bit line capping pattern BC. A pair of spacer structures SS disposed on opposite sides of one bit line structure BLS may have an asymmetric shape with respect to the bit line structure BLS. Each of the spacer structures SS may include a plurality of spacer layers, and may further include an air spacer in some example embodiments.

The lower conductive pattern 150 may be connected to a region of the active region ACT, for example, the second impurity region 105b. The lower conductive pattern 150 may be disposed between the bit lines BL and between the word lines WL. The lower conductive pattern 150 may pass through the buffer insulating layer 128 to be connected to the second impurity region 105b of the active region ACT. The lower conductive pattern 150 may be in direct contact with the second impurity region 105b. A lower surface of the lower conductive pattern 150 may be positioned on a level lower than that of the upper surface of the substrate 101, and may be positioned on a level higher than that of the lower surface of the bit line contact pattern DC. The lower conductive pattern 150 may be insulated from the bit line contact pattern DC by the spacer structure SS. The lower conductive pattern 150 may be formed of a conductive material, for example, polycrystalline silicon (Si), titanium (Ti), titanium nitride (TiN), tantalum (Ta), tantalum nitride (TaN), tungsten (W), tungsten nitride (WN), and aluminum (Al). In an example embodiment, a storage node contact 160 may include a plurality of layers.

A metal-semiconductor compound layer 155 may be disposed between the lower conductive pattern 150 and the first upper conductive pattern 160c. The metal-semiconductor compound layer 155 may be, for example, a layer obtained by silicidizing a portion of the lower conductive pattern 150 when the lower conductive pattern 150 includes a semiconductor material. The metal-semiconductor compound layer 155 may include, for example, cobalt silicide (CoSi), titanium silicide (TiSi), nickel silicide (NiSi), tungsten silicide (WSi), or another metal silicide. In some example embodiments, the metal-semiconductor compound layer 155 may be omitted.

The first upper conductive pattern 160c may be disposed on the lower conductive pattern 150 in the cell array region CAR. The first upper conductive pattern 160c may extend between the spacer structures SS to cover an upper surface of the metal-semiconductor compound layer 155. The second and third upper conductive patterns 160p1 and 160p2 may be disposed on the connection region IR and the peripheral circuit region PCR. Upper surfaces of the first to third upper conductive patterns 160c, 160p1, and 160p2 may be disposed on substantially the same level. The upper conductive patterns 160c, 160p1, and 160p2 may include a barrier layer 162 and a conductive layer 164, respectively. The barrier layer 162 may cover lower surface and side surfaces of the conductive layer 164. The barrier layer 162 may include a metal nitride, for example, at least one of titanium nitride (TiN), tantalum nitride (TaN), and tungsten nitride (WN). The conductive layer 164 may include a conductive material, for example, at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN).

The contact plug 160cp1 may be connected to the end portion EP of the word line WL. The contact plug 160cp1 may be provided in the connection region IR. The end portion EP of the word line WL may provide an end surface ES exposed in a direction of extension of the word line WL, that is, in the first direction X, and the contact plug 160cp1 may be disposed to overlap the end portion EP of the word line WL in a vertical direction Z. As an example, the contact plug 160cp1 may include a first portion P1 overlapping the word line WL and a second portion P2 not overlapping the word line WL.

The end portion EP of the word line WL may be disposed on the third device isolation layer 110C covering a sidewall of the active region ACT adjacent thereto. As an example, the end portion EP of the word line WL may be disposed on the third device isolation layer 110C including the first insulating liner 111, the second insulating liner 112, and the buried insulating layer 113.

The word line WL may include a first side and a second side connected to the end surface ES and opposing each other in a second direction Y, and the contact plug 160cp1 may be in contact with at least three surfaces of the word lines WL, for example, the end surface ES, the first side, and the second side of the word line WL. The contact plug 160cp1 may have a width wider than the width of the word line WL in plan view. A contact area between the contact plug 160cp1 and the word line WL may be increased, such that contact resistance may be reduced.

The contact plug 160cp1 may have a long axis in the first direction X in plan view. For example, the contact plug 160cp1 may have a long bar shape in the first direction X. For example, the contact plug 160cp1 may have an elliptical shape elongated in the first direction X.

The contact plug 160cp1 may include a barrier layer 162 and a conductive layer 164. The contact plug 160cp1 may be connected to the second upper conductive pattern 160p1 and may be formed integrally with the second upper conductive pattern 160p1. The contact plug 160cp1 may completely overlap the second upper conductive pattern 160p1 in the vertical direction Z.

The peripheral contact plug 160cp2 may pass through the first and second interlayer insulating layers 156 and 158 and the insulating liner 152 in the peripheral circuit region PCR to be connected to peripheral source/drain regions 30. A peripheral metal-semiconductor compound layer 35 may be disposed between the peripheral contact plug 160cp2 and the peripheral source/drain regions 30. The peripheral contact plug 160cp2 may be connected to the third upper conductive pattern 160p2, and may be formed integrally with the third upper conductive pattern 160p2.

The insulating patterns 165 may be disposed to pass through the upper conductive patterns 160c, 160p1, and 160p2. Each of the upper conductive patterns 160c, 160p1, and 160p2 may be divided into a plurality of upper conductive patterns by insulating patterns 165. The insulating patterns 165 may include an insulating material, for example, at least one of silicon oxide, silicon nitride, and silicon oxynitride.

A peripheral gate structure GS may be disposed on the peripheral active region ACT_P in the peripheral circuit region PCR. The peripheral gate structure GS may include the peripheral gate dielectric layer 40, the peripheral gate electrodes 41, 42, and 43, and a peripheral gate capping layer 46 being sequentially stacked. The insulating liner 152 may cover the peripheral gate structure GS. The peripheral active region ACT_P may be defined by the device isolation layer 110B, and the device isolation layer 110B may include the first insulating liner 111 and the second insulating liner 112 including different materials, but the present inventive concept is not limited thereto. The peripheral gate dielectric layer 40 may include silicon oxide, silicon nitride, or a high-κ material. The high-κ material may refer to a dielectric material having a dielectric constant higher than that of silicon oxide. The peripheral gate electrodes 41, 42, and 43 may have a structure and material similar to those of the bit line BL, but may have a shape wider than that of the bit line BL.

Figure 3:
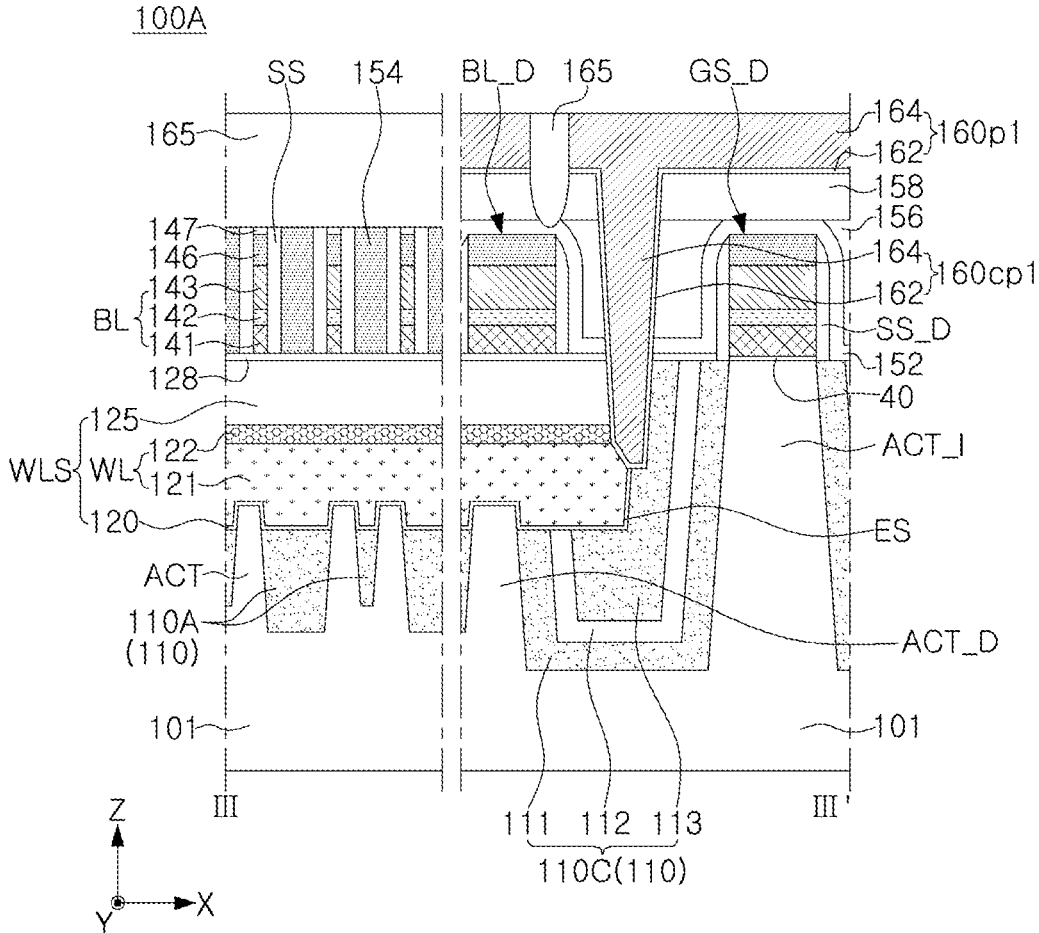
FIG. 3 is a schematic cross-sectional view of a semiconductor device according to an example embodiment.

FIG. 3 is a schematic cross-sectional view of a semiconductor device according to an example embodiment.

Referring to FIG. 3, in a semiconductor device 100A, an upper surface of the dummy active region ACT_D vertically overlapping the word line structure WLS may be positioned on a level substantially the same as that of an upper surface of the cell active region ACT vertically overlapping the word line structure WLS. In addition, the upper surface of the dummy active region ACT_D vertically overlapping the word line structure WLS may be adjacent to the dummy active region ACT_D, and may be positioned on a level higher than a level of an upper surface of the first device isolation layer 110A vertically overlapping the word line structure WLS. In the present example embodiment of the word line WL, the dummy active region ACT_D may be etched relatively less than that in the previous example embodiment.

Figure 4:
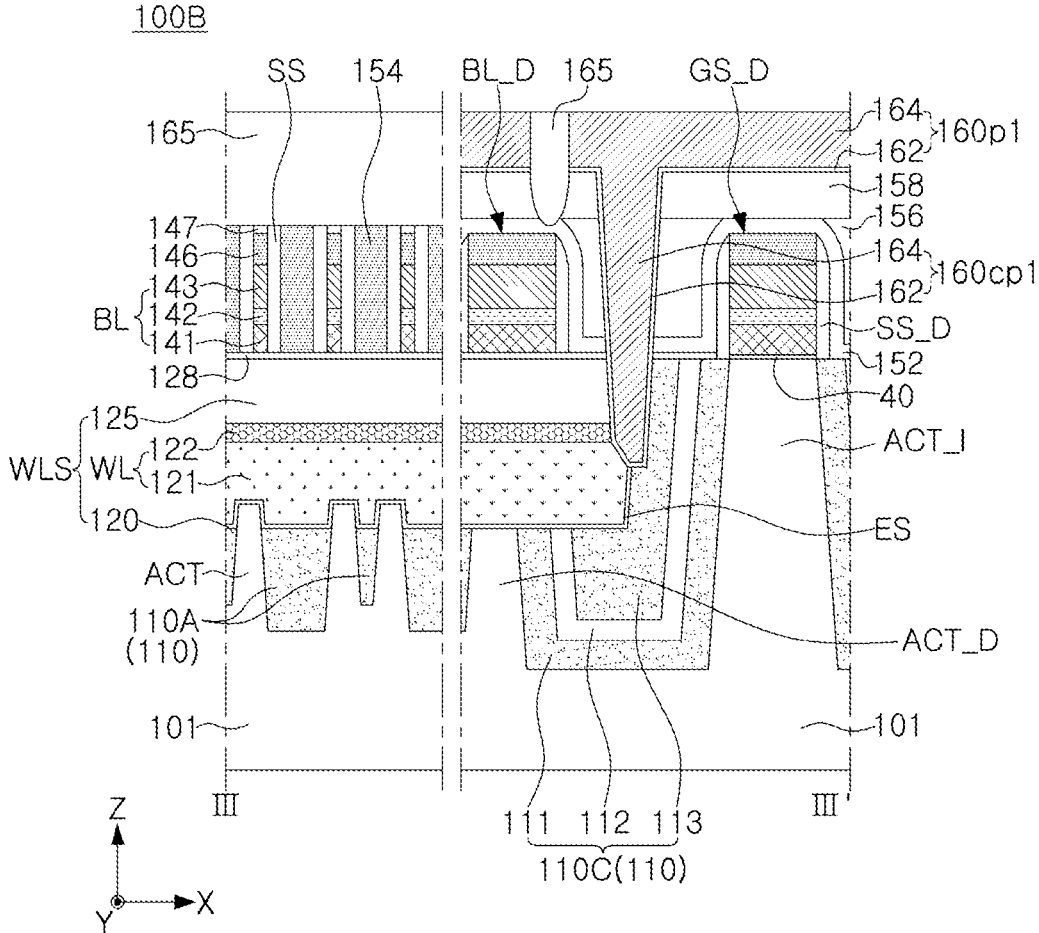
FIG. 4 is a schematic cross-sectional view of a semiconductor device according to an example embodiment.

FIG. 4 is a schematic cross-sectional view of a semiconductor device according to an example embodiment.

Referring to FIG. 4, in a semiconductor device 100B, an upper surface of the dummy active region ACT_D vertically overlapping the word line structure WLS may be adjacent to the dummy active region ACT_D, and may be positioned on a level substantially the same as that of an upper surface of the first device isolation layer 110A vertically overlapping the word line structure WLS. In the present example embodiment, the dummy active region ACT_D may be etched relatively more than that in the previous example embodiment.

Figure 5:
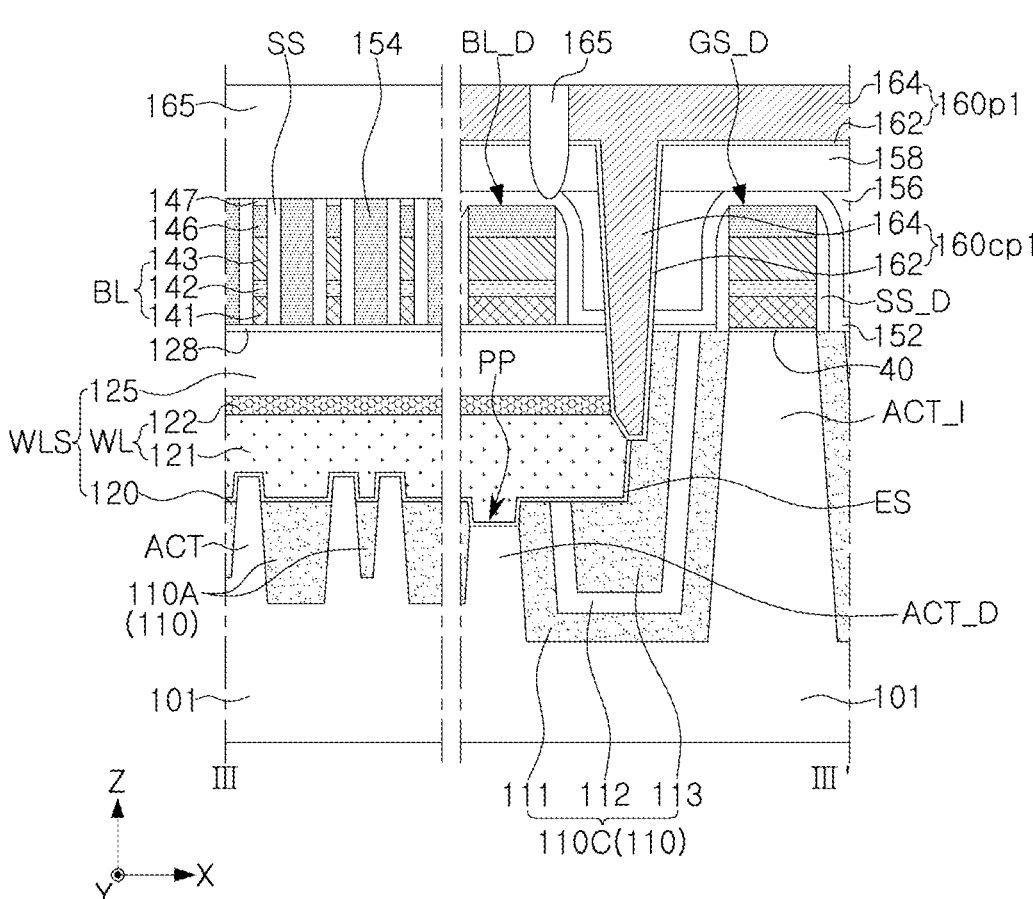
FIG. 5 is a schematic cross-sectional view of a semiconductor device according to an example embodiment.

FIG. 5 is a schematic cross-sectional view of a semiconductor device according to an example embodiment.

Referring to FIG. 5, in a semiconductor device 100C, an upper surface of the dummy active region ACT_D vertically overlapping the word line structure WLS may be adjacent to the dummy active region ACT_D and may be positioned on a level lower than that of an upper surface of the first device isolation layer 110A vertically overlapping the word line structure WLS. In the present example embodiment, the dummy active region ACT_D may be etched relatively more than that in the previous example embodiment. The word line WL may include a protrusion portion PP protruding toward the dummy active region ACT_D. The protrusion portion PP may have an inclined side surface becoming narrower toward the dummy active region ACT_D.

Figure 6:
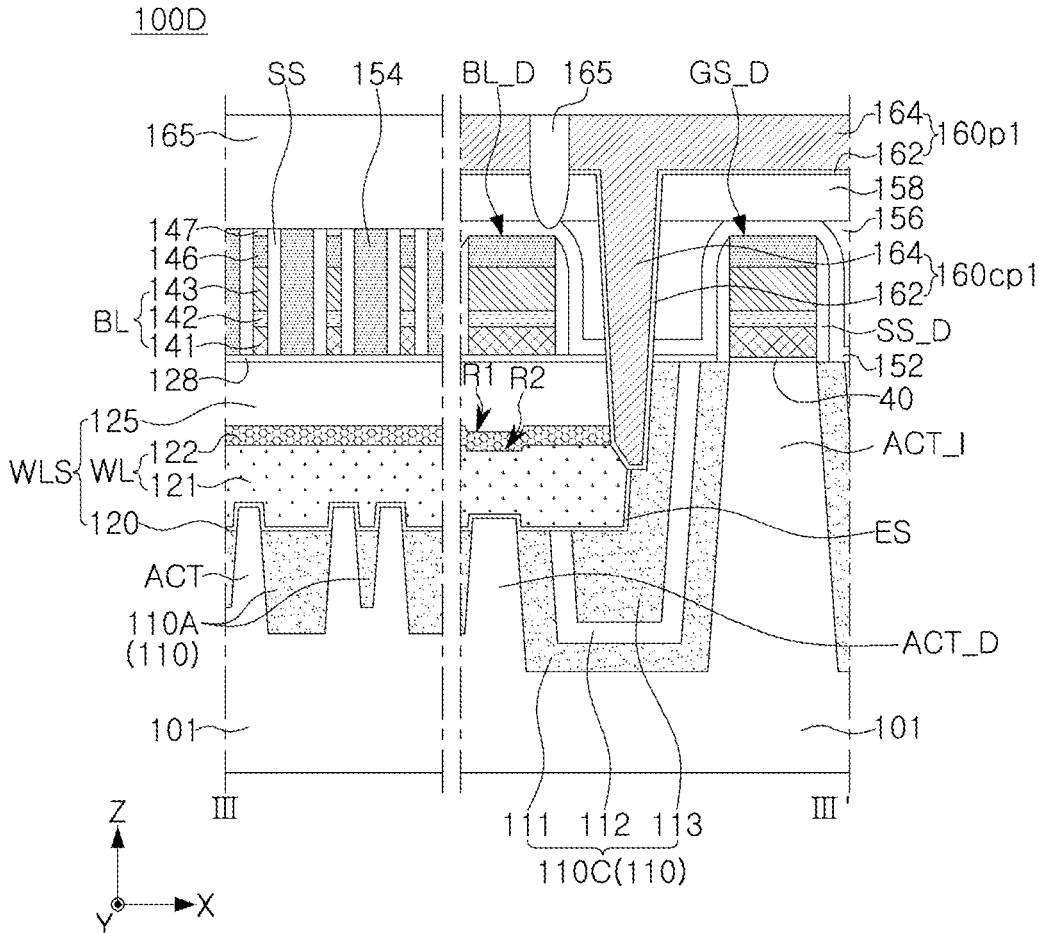
FIG. 6 is a schematic cross-sectional view of a semiconductor device according to an example embodiment.

FIG. 6 is a schematic cross-sectional view of a semiconductor device according to an example embodiment.

Referring to FIG. 6, in a semiconductor device 100D, the upper pattern 122 may have an upper recessed region R1 recessed by the gate capping layer 125, and the lower pattern 121 may have a lower recessed region R2 recessed by the upper pattern 122. At least a portion of each of the upper and lower recessed regions R1 and R2 may vertically overlap the dummy active region ACT_D. As a level of an upper surface of the dummy active region ACT_D is lower than a level of an upper surface of the cell active region ACT, a portion of
the upper and lower patterns 121 and 122 overlapping the
dummy active region ACT_D may be lower than a portion
of the upper and lower patterns 121 and 122 overlapping the
cell active region ACT. Accordingly, the upper and lower
patterns 121 and 122 may have the upper recessed region R1
and the lower recessed region R2, respectively.

Figure 7A:
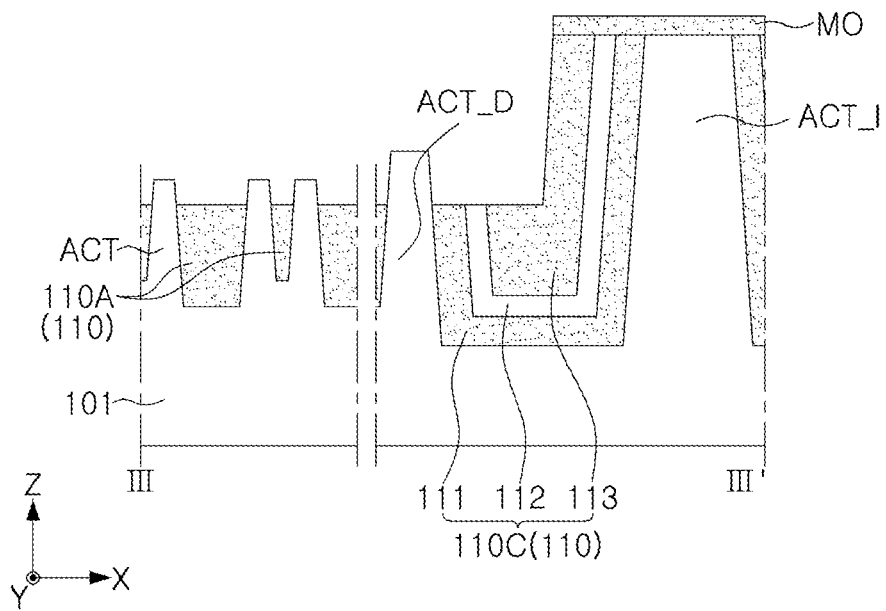
FIGS. 7A to 7C are cross-sectional views illustrating a method of manufacturing a semiconductor device according to an example embodiment.
Figure 7B:
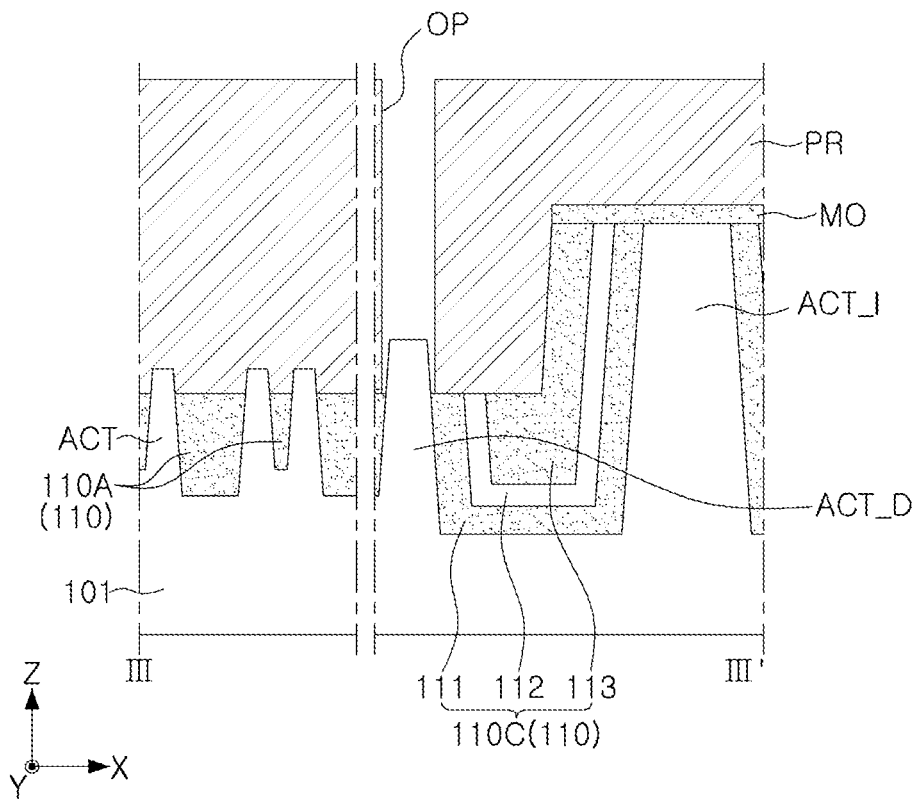
Figure 7C:
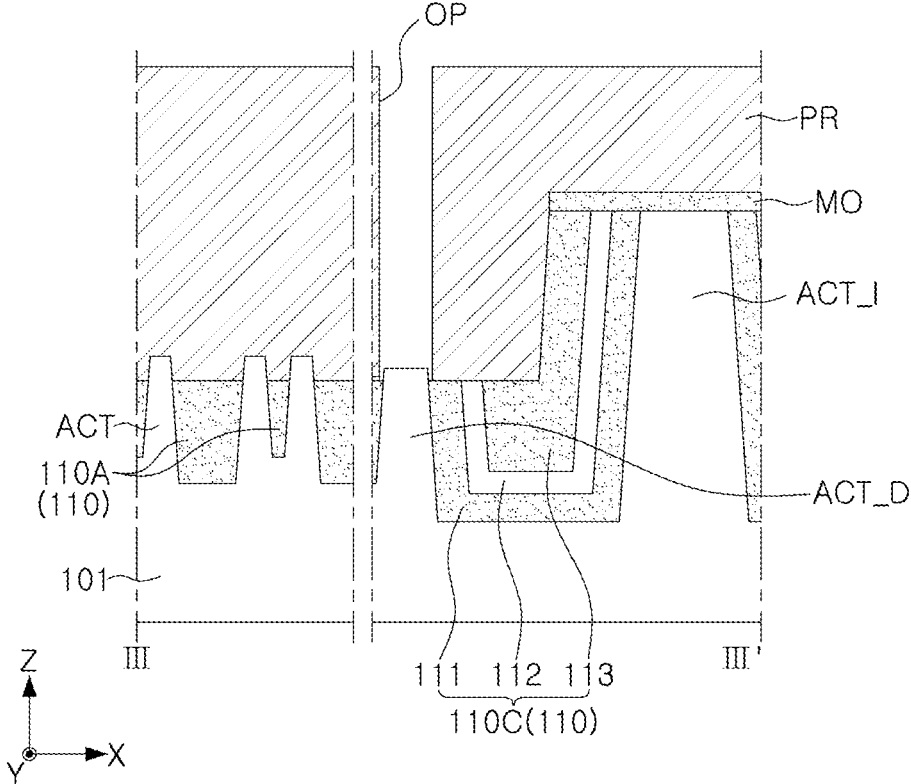

FIGS. 7A to 7C are cross-sectional views illustrating a
method of manufacturing a semiconductor device according
to an example embodiment.

Referring to FIG. 7A, a portion of the substrate 101 may
be etched to form a trench, and an insulating material may
be filled in the trench, thereby forming the device isolation
region 110. The cell active region ACT and the dummy
active region ACT_D may be defined by the device isolation
region 110. Subsequently, a protective mask MO and a hard
mask may be formed. The protective mask MO may include
silicon oxide, and the hard mask may include an amorphous
carbon layer (ACL). Subsequently, regions in which the
word line WL will be formed may be etched by a subsequent
process. Accordingly, the protective mask MO and the hard
mask may remain in unetched regions. In some example
embodiments, the hard mask may be removed by an ashing
process and a strip process to expose the protective mask
MO.

Referring to FIG. 7B, a photoresist PR may be applied.

In an example, the photoresist PR may be formed on the
remaining hard mask. In another example, the hard mask
may be removed to form the photoresist PR on the exposed
protective mask MO.

Subsequently, the photoresist PR may be subjected to an
exposure process exposed to light and a development pro-
cess in which a portion of the photoresist PR is removed by
a developer. Accordingly, an opening OP of the photoresist
PR exposing the dummy active region ACT_D may be
formed. In order to form the opening OP, a negative type
photoresist PR may be used. In some example embodiments,
a positive type photoresist (PR) and a negative tone devel-
oper may be used in combination.

Referring to FIG. 7C, the dummy active region ACT_D exposed by the opening of the photoresist PR may be etched.
Accordingly, an upper surface of the dummy active region
ACT_D may be positioned on a level lower than that of an
upper surface of the cell active region ACT.

Referring back to FIGS. 1 to 2C, the semiconductor
device 100 of FIGS. 1 to 2C may be manufactured by
removing the photoresist PR and forming the word line
structure WLS, the bit line structure BLS, the insulating
pattern 165, and the like.

One or more embodiments may provide a semiconductor device having improved electrical properties and reliability.

According to example embodiments, a dummy active
region may be etched through an additional process, thereby
preventing a defect such as breakage of a word line and
providing a semiconductor device having improved electrical properties and reliability.

Example embodiments have been disclosed herein, and
although specific terms are employed, they are used and are
to be interpreted in a generic and descriptive sense only and
not for purpose of limitation. In some instances, as would be
apparent to one of ordinary skill in the art as of the filing of
the present application, features, characteristics, and/or ele-
ments described in connection with a particular embodiment
may be used singly or in combination with features, char-
acteristics, and/or elements described in connection with
other embodiments unless otherwise specifically indicated.
Accordingly, it will be understood by those of skill in the art that various changes in form and details may be made
without departing from the spirit and scope of the present
invention as set forth in the following claims.

What is claimed is:
1. A semiconductor device, comprising:
a substrate having a cell array region, a peripheral circuit
region,
a connection region between the cell array region and the
peripheral circuit region;
a device isolation region defining a cell active region on
the cell array region, a peripheral active region on the
peripheral circuit region, and a dummy active region on
the connection region;
a gate structure including a gate electrode extending into
the device isolation region on the connection region
across the cell active region on the cell array region,
wherein the dummy active region is adjacent to the cell
active region, and
wherein an upper surface of the dummy active region
vertically overlapping the gate structure is positioned
on a level lower than a level of an upper surface of the
cell active region vertically overlapping the gate struc-
ture.
2. The semiconductor device as claimed in claim 1,
wherein the upper surface of the dummy active region
vertically overlapping the gate structure is positioned on a
level about 20 Å to about 500 Å lower than a level of the
upper surface of the cell active region vertically overlapping
the gate structure.
3. The semiconductor device as claimed in claim 1,
wherein a width of the dummy active region is wider than a
width of the cell active region.
4. The semiconductor device as claimed in claim 1,
wherein a width of the dummy active region is in a range of
about 1.5 times to about 3 times a width of the cell active
region.
5. The semiconductor device as claimed in claim 1,
wherein:
the device isolation region includes a first device isolation
layer defining the cell active region and a second device
isolation layer defining at least a portion of the dummy
active region, and
a lower surface of the second device isolation layer is
positioned on a level lower than that of a lower surface
of the first device isolation layer.
6. The semiconductor device as claimed in claim 1,
wherein the gate electrode has an end surface in the device
isolation region on the connection region.
7. The semiconductor device as claimed in claim 1,
wherein the upper surface of the dummy active region
vertically overlapping the gate structure is adjacent to the
dummy active region, and is positioned on a level higher
than that of an upper surface of the device isolation region
vertically overlapping the gate structure.
8. The semiconductor device as claimed in claim 1,
wherein the upper surface of the dummy active region
vertically overlapping the gate structure is adjacent to the
dummy active region, and is positioned on a level substan-
tially the same as that of an upper surface of the device
isolation region vertically overlapping the gate structure.
9. The semiconductor device as claimed in claim 1,
wherein the upper surface of the dummy active region
vertically overlapping the gate structure is adjacent to the
dummy active region, and is positioned on a level lower than
that of an upper surface of the device isolation region
vertically overlapping the gate structure.

10. The semiconductor device as claimed in claim 9, wherein the gate electrode includes a protrusion portion protruding toward the dummy active region.

11. The semiconductor device as claimed in claim 10, wherein the protrusion portion has an inclined side surface becoming narrower toward the dummy active region.

12. A semiconductor device, comprising:
a substrate having a cell array region, a peripheral circuit region, and a connection region between the cell array region and the peripheral circuit region;
a device isolation region defining, on the substrate, a cell active region on the cell array region, a peripheral active region on the peripheral circuit region, and a dummy active region on the connection region;
a gate structure including a gate electrode extending in a first direction across the cell active region and the dummy active region on the cell array region,
wherein, in the first direction, a width of the dummy active region is wider than a width of the cell active region, and
wherein a portion of a lower surface of the gate structure in contact with an upper surface of the dummy active region is positioned on a level lower than that of a portion of the lower surface of the gate structure in contact with an upper surface of the cell active region.

13. The semiconductor device as claimed in claim 12, wherein:
the gate electrode includes a lower pattern and an upper pattern on the lower pattern, and
the gate structure further includes a gate capping layer on the gate electrode.

14. The semiconductor device as claimed in claim 13, wherein:
the upper pattern includes a doped semiconductor material, and
the lower pattern includes a metal or a metal nitride.

15. The semiconductor device as claimed in claim 14, wherein:
the upper pattern has an upper recessed region recessed by the gate capping layer, and the lower pattern has a lower recessed region recessed by the upper pattern.

16. The semiconductor device as claimed in claim 15, wherein at least a portion of each of the upper and lower recessed regions vertically overlaps the dummy active region.

17. A semiconductor device, comprising:
a substrate having a cell array region, a peripheral circuit region,
a connection region between the cell array region and the peripheral circuit region;
a bit line structure on the cell array region, the bit line structure including a bit line and a bit line contact pattern connected to a lower surface of the bit line;
a dummy bit line structure on the connection region, the dummy bit line structure including a dummy bit line;
a cell active region below the bit line structure and electrically connected to the bit line through the bit line contact pattern;
a dummy active region below the dummy bit line structure and electrically insulated from the dummy bit line; and
a gate structure including a gate electrode extending across the cell active region on the cell array region,
wherein a distance between an upper surface of the dummy active region and a lower surface of the dummy bit line is greater than a distance between an upper surface of the cell active region and the lower surface of the bit line.

18. The semiconductor device as claimed in claim 17, wherein the dummy bit line has a width wider than that of the bit line.

19. The semiconductor device as claimed in claim 17, wherein at least a portion of the dummy active region vertically overlaps the dummy bit line.

20. The semiconductor device as claimed in claim 17, wherein a distance between the upper surface of the dummy active region and an upper surface of the gate electrode is greater than a distance between the upper surface of the cell active region and the upper surface of the gate electrode.

* * * * *